United States Patent
Miyake

(10) Patent No.: US 6,692,623 B2
(45) Date of Patent: Feb. 17, 2004

(54) VACUUM ARC VAPOR DEPOSITION APPARATUS AND VACUUM ARC VAPOR DEPOSITION METHOD

(75) Inventor: Koji Miyake, Kyoto (JP)

(73) Assignee: Nissin Electric Co., Ltd., Kyoto (JP)

(*) Notice: Subject to any disclaimer, the term of this patent is extended or adjusted under 35 U.S.C. 154(b) by 0 days.

(21) Appl. No.: 10/107,363

(22) Filed: Mar. 28, 2002

(65) Prior Publication Data

US 2002/0157609 A1 Oct. 31, 2002

(30) Foreign Application Priority Data

Mar. 29, 2001 (JP) .................... P.2001-095815

(51) Int. Cl.[7] ............................... C23C 14/32
(52) U.S. Cl. .................... 204/298.41; 204/192.38
(58) Field of Search ............... 204/192.38, 298.41

(56) References Cited

U.S. PATENT DOCUMENTS

| 4,724,058 A |   | 2/1988 | Morrison, Jr. ........ 204/192.38 |
| 5,279,723 A |   | 1/1994 | Falabella et al. ..... 204/192.38 |
| 5,298,136 A | * | 3/1994 | Ramalingam .......... 204/192.38 |
| 5,480,527 A | * | 1/1996 | Welty ................. 204/192.38 |

FOREIGN PATENT DOCUMENTS

| EP | 0 926 699 A1 | 6/1999 |
| JP | A 10-505633  | 6/1998 |
| JP | A 10-280135  | 10/1998 |
| JP | A 2000 34561 | 2/2000 |
| JP | A 2001 3160  | 1/2001 |
| WO | WO 95/29272  | 11/1995 |

OTHER PUBLICATIONS

European Search Report dated Jun. 18, 2002, from European Patent Application No. EP02007409.2–2119.

* cited by examiner

Primary Examiner—Rodney G. McDonald
(74) Attorney, Agent, or Firm—Finnegan, Henderson, Farabow, Garrett & Dunner LLP

(57) ABSTRACT

A vacuum arc vapor deposition apparatus includes a plurality of magnetic coils for guiding a plasma produced by a vacuum arc evaporating source to the vicinity of a substrate in a film forming chamber by use of a deflection magnetic field. The vacuum arc vapor deposition apparatus further includes a coil power source for reversing a coil current to be fed to the magnetic coils, and a control unit for controlling the coil power source to reverse the flowing direction of the coil current.

13 Claims, 13 Drawing Sheets

VACUUM ARC VAPOR DEPOSITION APPARATUS AND VACUUM ARC VAPOR DEPOSITION METHOD

BACKGROUND OF THE INVENTION

1. Field of the Invention

The present invention relates to a vacuum arc vapor deposition apparatus and a vacuum arc vapor deposition method used for forming a thin film of excellent lubricating property and hardness on such a substrate as an automobile part, machine part, machine tool, and metal mold, which includes a magnetic coil for guiding a plasma produced by a vacuum arc evaporating source to the vicinity of the substrate. More particularly, the invention relates to a vacuum arc vapor deposition apparatus for preventing degradation of the uniformity of a thickness distribution on a surface of the substrate, which is caused by the drift of the plasma in a magnetic field developed by the magnetic coil.

2. Description of the Related Art

A vacuum arc vapor deposition apparatus forms a film (thin film) on a substrate by using a vacuum arc evaporating source which vaporizes a cathode by vacuum arc discharge to produce a plasma containing a cathode material. The vacuum arc vapor deposition apparatus is advantageous in that a film forming rate is high and highly productive.

The cathode material vaporized from the cathode of the vacuum arc evaporating source contains macro particles (called droplets) of several $\mu$m or larger in addition to micro particles suitable for film formation. The macro particles fly to and attach onto the surface of the substrate, possibly damaging the adhesion property and smoothness (surface roughness) of the film.

To solve the above problems, the following two techniques are already proposed: 1) technique for transporting the plasma to the substrate after the macro particles are removed from the plasma by the utilization of a deflection magnetic field (e.g., Japanese Patent Unexamined Publication No. 2001-3160), and 2) technique to make the macro particles fine by converging the plasma by the magnetic field to increase density of the plasma (e.g., Japanese Patent Unexamined Publication No. 2000-34561).

FIG. 10 is a cross sectional view showing a vacuum arc vapor deposition apparatus which uses the technique 1) above. The vacuum arc vapor deposition apparatus includes a film forming chamber (or vacuum chamber) 2 which is vacuum discharged by a vacuum discharging apparatus (not shown). A holder 8 for holding a substrate 6 on which a film is formed is located in the film forming chamber.

In this example, a gas 4, such as inactive gas or reaction gas, is introduced from a gas source (not shown) into the film forming chamber 2.

Abias voltage $V_B$ of −50V to −500V, for example, is applied from a bias power source 10 to the holder 8 and the substrate 6.

The film forming chamber 2 is connected to a vacuum arc evaporating source 12 through a pipe 28 (deflection pipe) bent about 90° in this example.

The vacuum arc evaporating source 12 includes a cathode 14 mounted on an end plate 29 of the pipe 28 with an insulating material 20 inserted there between. The cathode 14 is vaporized through vacuum arc discharge occurring between the cathode 14 and the pipe 28 serving also as an anode to produce a plasma 18 containing a cathode material 16. An anode electrode may be individually provided. Here, the "cathode material" means material forming the cathode 14. An arc discharging voltage is applied from an arc power source 22 to between the cathode 14 and the pipe 28. The vacuum arc evaporating source 12 includes a known trigger mechanism, a water cooling mechanism and the like. Those mechanisms are not illustrated in the specification, for simplicity.

A plurality of magnetic coils 24 are provided around an outer periphery of the pipe 28. The magnetic coils generate a magnetic field for deflecting the plasma 18 produced by the vacuum arc evaporating source 12, and guides (transports) the plasma 18 to the vicinity of the substrate 6 in the film forming chamber 2. Some of magnetic field lines 26 generated by the magnetic coils 24 are roughly illustrated in the figure, and as shown, those magnetic field lines extend substantially along an inner surface of the pipe 28. Those magnetic coils 24 are connected in series, and fed with a coil current $I_c$ for generating the magnetic field from a coil power source 30.

The plasma 18 produced by the vacuum arc evaporating source 12 is bent to substantially along the magnetic field lines 26 and transported to the substrate 6. The macroparticles emitted from the cathode 14 are electrically neutral or negatively charged in the plasma 18. A mass of the macro particle is considerably large. Accordingly, those particles go straight irrespective of the magnetic field, and hit the inner wall of the bent pipe 28 and hence fail to reach the substrate 6. As a result, the plasma 18 little containing the macro particles is led to the vicinity of the substrate 6. Thus, it is prevented that the macro particles attach to the substrate 6. The apparatus which has the magnetic coils 24, pipe 28 and coil power source 30 (coil power source 40 in FIG. 1) as mentioned above is also called a magnetic filter where attention is put on the macro-particle removing function.

Ions (i.e., ionized cathode material 16) in the plasma 18 thus transported to near the substrate 6 are attracted to the substrate 6 under the bias voltage $V_B$ and the like, and deposited on the surface of the substrate to form a thin film on the substrate. When a reaction gas which reacts with the cathode material 16 to form a chemical compound is used for the gas 4, a compound thin film may be formed.

When an electron is transported in a uniform magnetic field, as well known, the electron makes a gyrating movement such that it winds round the magnetic field lines, under Lorentz forces given by the following equation 1. In the equation, q is a charge, v is an electron velocity, and B is a flux density (The same rule applies correspondingly to the description to follow.).

$$F = qvB \qquad \text{[Equation 1]}$$

Accordingly, in a uniform magnetic field, electrons emitted from two positions P and Q shown in FIG. 11 move along magnetic field lines 26 uniformly distributed, reach the substrate 6, and are incident on positions near positions $P_1$ and $Q_1$ corresponding to the positions P and Q.

Actually, a magnetic field developed by the magnetic coils 24 is not uniform and has gradients of a magnetic field without exception. For drift of charged particles, such as electrons, in a magnetic field having gradients, reference is made to "Newest Plasma Production Technique", by Yoshinobu Kawai, published by IPC corporation on Aug. 5, 1991, pages 12 to 21. As described, the charged particle drifts at a drift velocity $V_D$ given by the following equation 2. In the equation, $\mu$ is magnetic permeability, $\nabla B$ is a gradient (vector) of the magnetic field, and Bv is a magnetic field (vector), and other things are the same as mentioned above. $\nabla$ is a nabla or Hamiltonian operator.

$$V_D = -\mu(\nabla B \times Bv)/(qB^2) \qquad \text{[Equation 2]}$$

The gradient of the magnetic field will be discussed by using an apparatus which transports the plasma 18 by use of the deflection magnetic field as shown in FIG. 10 (or FIG. 1 to be described later).

A case where the magnetic coil 24 and the pipe 28 are circular in cross section is shown in FIGS. 12 to 18. In FIGS. 12 to 15, the cathodes 14a and 14b are simply represented by two positions "P" and "Q" (the same thing is correspondingly applied to the illustrations of FIGS. 19 to 21 to be described later). In FIGS. 16 to 18, the cathodes 14a and 14b are specifically illustrated (the same thing is correspondingly applied to the illustrations of FIGS. 22 and 23 to be described later and FIGS. 2 to 7).

In this case, the nature of the circular magnetic coils 24 gives the magnetic field in the pipe 28 such a gradient $\nabla B$ as shown in FIG. 14 that, an intensity of the magnetic field is lowest at the center 28a of the pipe inside, and gradually increases toward the outside. In a case where a plurality of magnetic coils 24 are disposed while being bent as shown in FIG. 10, for example, the lowest intensity of the magnetic field is located at a position somewhat outwardly shifted from the center 28a, actually.

Accordingly, as shown in FIGS. 12 and 13, electrons 32a and 32b emitted from the two positions P and Q drift at a drift velocity $V_D$ in the circumferential direction (FIG. 15) by the gradient $\nabla B$ of the magnetic field (FIG. 14), as defined in the equation 2. Therefore, the electrons land on the substrate 6 at positions shifted in the circumferential direction. The same thing is true for the ions, and hence the plasma drifts, while being shifted in the circumferential direction.

In a case of FIGS. 16 and 17 where two vacuum arc evaporating sources 12 are vertically spaced from each other and arranged along the z-axis, plasma 18 produced by the cathodes 14a and 14b reaches the substrate 6 while drifting in the circumferential direction. A density distribution of each the plasma produced by the cathodes 14a and 14b is usually depicted in a shape of an outward curve; the density is highest at the center of the plasma in cross section and gradually decreases toward its fringe. Accordingly, peaks 36a and 36b and fringes 38a and 38b of a film thickness distribution (viz., a film forming velocity distribution) appear on the surface of the substrate 6 as shown in a FIG. 18 instance. As shown, those peaks and fringes are located at positions shifted in the circumferential direction from positions 34a and 34b corresponding to the cathodes 14a and 14b.

A case where the magnetic coils 24 and the pipe 28 are rectangular in their cross section is illustrated in FIGS. 19 to 23.

A magnetic field within the pipe 28 has such a gradient $\nabla B$ as shown in FIG. 20 that an intensity of the magnetic field is lowest at a part 28b slightly closer to the outside than the center 28a and gradually increases toward the outside. The gradient $\nabla B$ depends on the nature of the rectangular magnetic coils 24 and the arrangement of the plurality of magnetic coils 24 arranged while being bent as shown in FIG. 10 and the like.

As shown in FIGS. 12 and 19, electrons 32a and 32b emitted from two positions P and Q drift at a drift velocity $V_{D_z}$ as defined in the equation 2 (FIG. 21), in a downward and oblique direction, which is the resultant of the downward direction and the lateral direction, by the gradient $\nabla B$ of the magnetic field 8 (FIG. 20).

In a case of FIGS. 16 and 22 where two vacuum arc evaporating sources 12 are vertically spaced from each other and arranged along the z-axis, plasma 18 produced by the cathodes 14a and 14b reaches the substrate 6 while drifting in the downward and oblique direction. Accordingly, peaks 36a and 36b and fringes 38a and 38b of a film thickness distribution appear on the surface of the substrate 6 as shown in a FIG. 23 instance. As shown, the peaks 36a and 36b and fringes 38a and 38b are located at positions shifted in the downward and oblique direction from positions 34a and 34b corresponding to the cathodes 14a and 14b.

Actually, a shift of the peak 36a is different from that of the peak 36b. The lateral and downward shifts of the peak 36b on the lower side (as viewed in the z-axis, the same will apply hereinafter.) are greater than that of the peak 36a on the upper side. This fact was empirically confirmed. The peaks 36a and 36b are shifted in directions in which the distance between them increases. Such an example is illustrated in FIG. 23. Where such shifts occur, film formation little occurs at the central part of the substrate 6. Further, the shifts become larger as a distance of the substrate 6 from the vacuum arc evaporating source 12 increases.

Where the peaks 36a and 36b and the fringes 38a and 38b of the film thickness distribution on the surface of the substrate 6 are shifted by the gradient $\nabla B$ of the magnetic field, it is difficult to form a film on the substrate 6 as desired. The shift will deteriorate the uniformity of the thickness distribution on the surface of the substrate 6. When comparing with a case where the magnetic coils 24 and the pipe 28 are circular in cross section, in a case where the where the magnetic coils 24 and the pipe 28 are rectangular in cross section, the peaks 36a and 36b of the thickness distribution are shifted apart away from each other, and the shifts of them become larger as a distance between the substrate 6 ad the vacuum arc evaporating source 12 increases. Accordingly, the uniformity of the thickness distribution on the surface of the substrate 6 is more deteriorated.

SUMMARY OF THE INVENTION

Accordingly, an object of the invention is to provide a vacuum arc vapor deposition apparatus and a vacuum arc vapor deposition method which can prevent degradation of the uniformity of a film thickness distribution on a surface of a substrate, which is caused by the drift of a plasma in a magnetic field developed by a magnetic coil.

In order to accomplish the object above, the following means are adopted. According to the present invention, there is provided a vacuum arc vapor deposition apparatus comprising: a film forming chamber containing a substrate and being vacuum discharged; a vacuum arc evaporating source for producing a plasma containing a cathode material by vaporizing a cathode by vacuum arc discharge; a magnetic coil for generating a magnetic field for deflecting or converging the plasma produced by the vacuum arc evaporating source, and guiding the plasma to the vicinity of the substrate within the film forming chamber; a coil power source for feeding a coil current for generating the magnetic field to the magnetic coil, the coil power source reversing a flowing direction of the coil current fed to the magnetic coil; and a control unit for controlling the coil power source to reverse the flowing direction of the coil current fed to the magnetic coil.

The plasma is guided (transported) to the vicinity of the substrate by the magnetic field developed by the magnetic coils before and after the flowing direction of the coil current fed to the magnetic coils is reversed. The reason for this is that so long as the magnetic field exists, the plasma is guided by the magnetic field.

When the flowing direction of the current fed to the magnetic coils is reversed, the gradient $\nabla B$ of the magnetic field remains unchanged, but the direction of the vector of magnetic field $B_y$ is reversed. As seen also from the equation 2, the drift velocity $V_D$ acting on the plasma to be transported is reversed in its direction.

The phenomenon, already stated, that the peak positions of the thickness distribution on the substrate surface are shifted by the drift of the plasma being under transportation, appears in the inverted state on the substrate surface when the flowing direction of the coil current is reversed. This inversion reduces the non-uniformity of the film thickness distribution, thereby preventing the deterioration of the uniformity of the film thickness distribution on the substrate surface. The result is that a film maybe formed more uniformly over a broader area on the substrate.

DETAILED DESCRIPTION OF THE INVENTION

Figure 1:
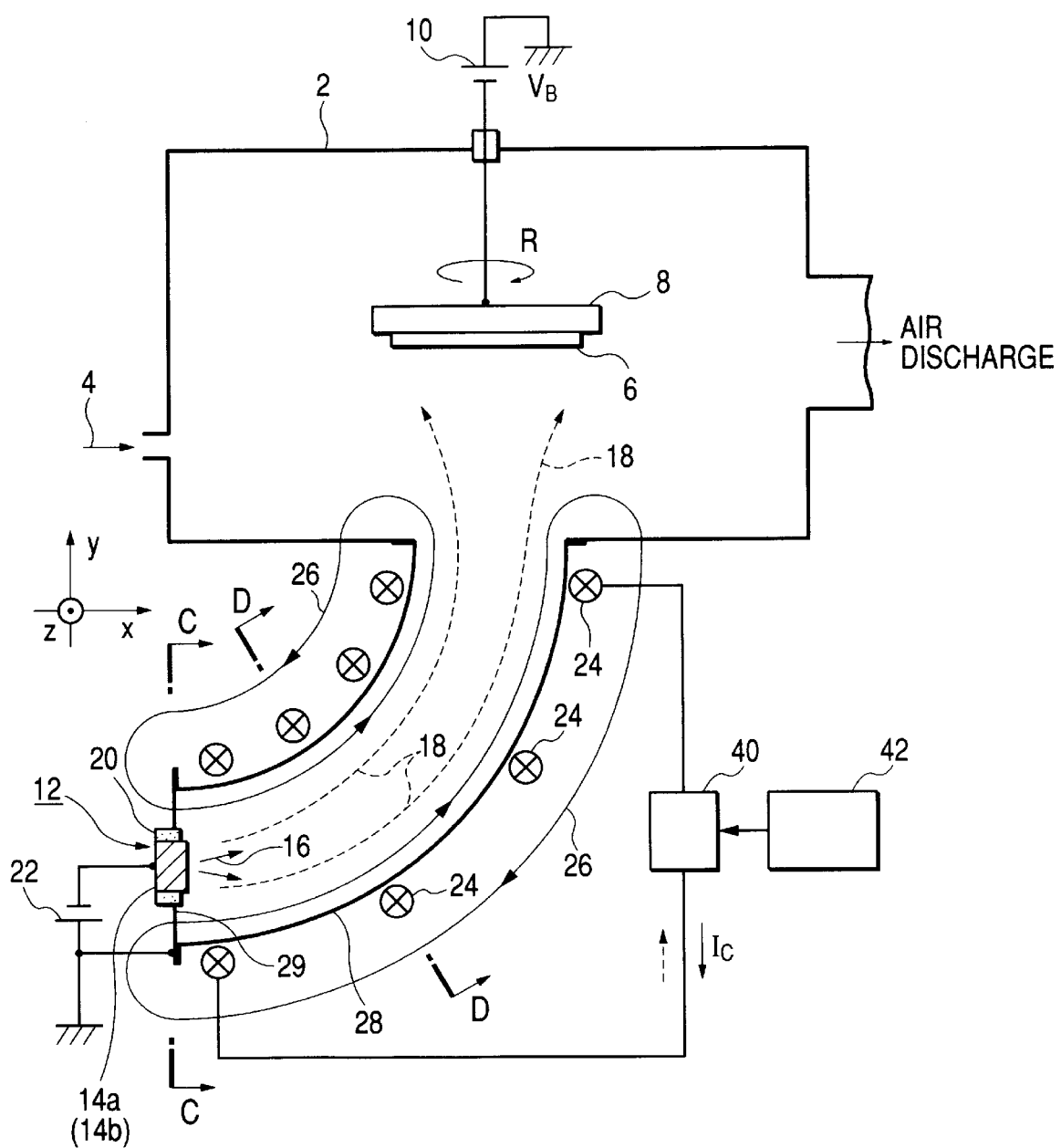
FIG. 1 is a diagram showing a vacuum arc vapor deposition apparatus according to the present invention.
Figure 2:
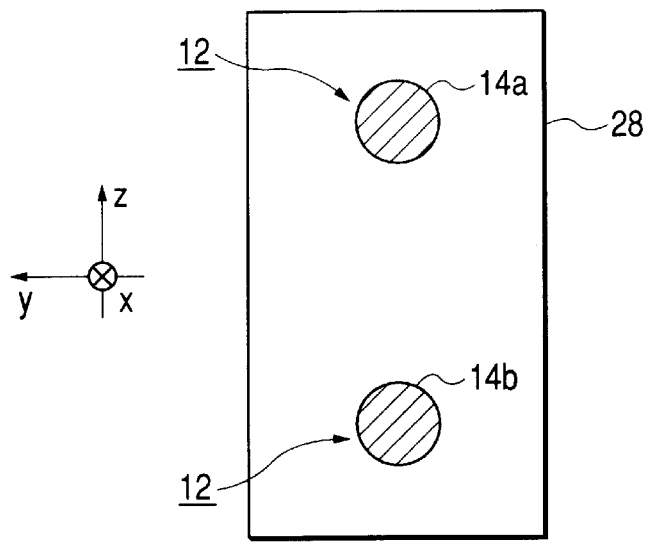
FIG. 2 shows, in a view in the direction C—C in FIG. 1, an arrangement of cathodes in two vacuum arc evaporating sources increase where a magnetic coil and a pipe are rectangular in cross section.

FIG. 1 is a diagram exemplarily showing a vacuum arc vapor deposition apparatus according to the present invention. FIG. 2 shows, in a view in the direction C—C in FIG. 1, an arrangement of cathodes in two vacuum arc evaporating sources in a case where a magnetic coil and pipe are rectangular in cross section.

Figure 22:
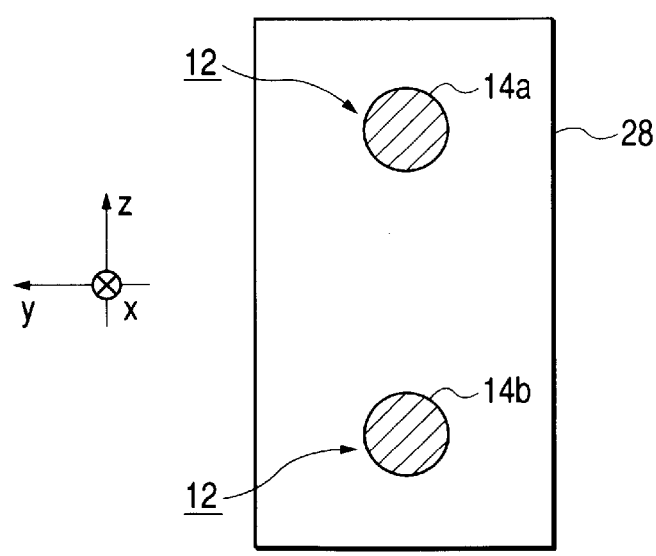
FIG. 22 shows, in a view in the direction of C—C in FIG. 16, an arrangement of cathodes in a case where a magnetic coil and a pipe are rectangular in cross section.
Figure 23:
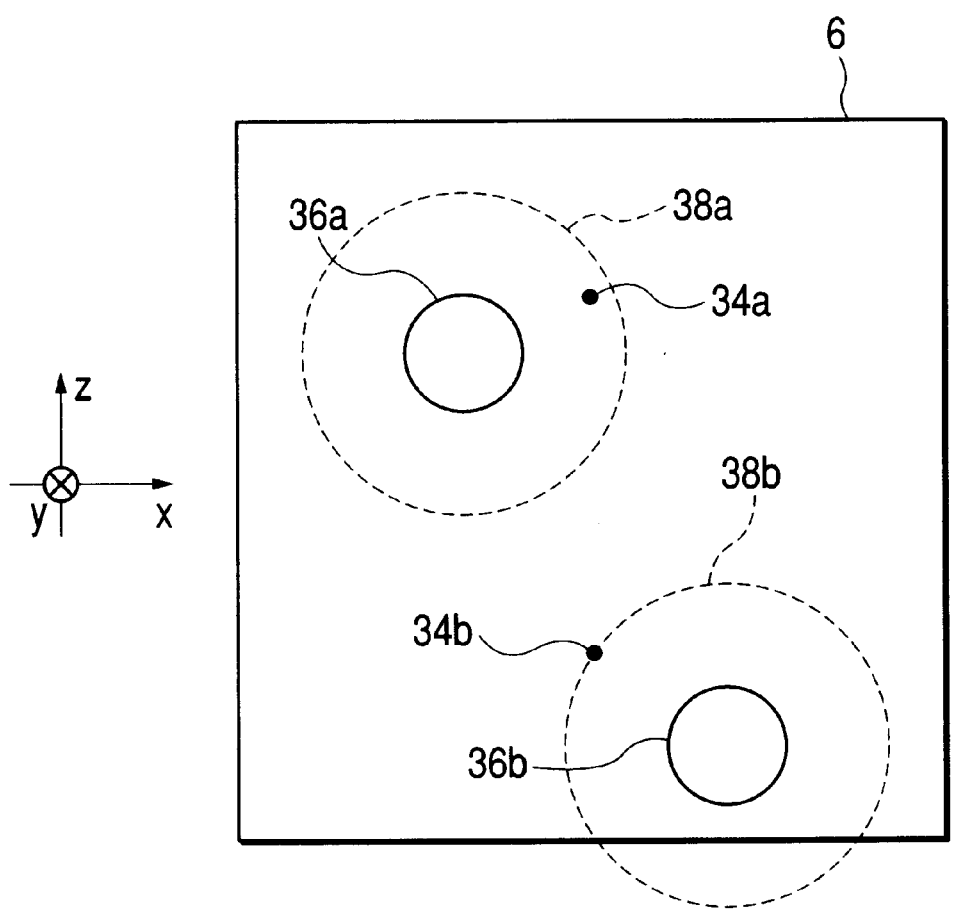
FIG. 23 is a diagram showing film thickness distributions on a surface of a film formed substrate, which are caused by the cathodes in FIG. 22.

FIG. 2 is the same diagram as FIG. 22 described above. In the figures, like or same portions used in FIGS. 10 to 23 are designated by like reference numerals. Description will be given placing emphasis on the differences of the embodiment from the related art apparatus.

The vacuum arc vapor deposition apparatus shown in FIG. 1 comprises a coil power source 40 and a control unit 42. The coil power source 40 is used in place of the related art coil DC power source 30 and reverses the flowing direction of coil current $I_c$ which flow through a plurality of magnetic coils $24_c$. The control unit 42 controls the coil power source 40 to reverse the flowing direction of the coil current $I_c$ flowing through each magnetic coil 24.

The coil power source 40 may be a bipolar power source capable of feeding bipolar current or may be a combination of two DC power sources; one feeds a positive current, and the other feeds a negative current.

In the vacuum arc vapor deposition apparatus, two vacuum arc evaporating sources 12 are arranged along the z-axis while being vertically separated from each other.

Each of magnetic coils 24 and the pipe 28 may be circular in cross section as in the case described above. In the cases of FIGS. 2 to 7, the cross section configuration of them is rectangular.

The plasma 18 produced by the vacuum arc evaporating source 12 is guided (transported) to the vicinity of the substrate 6 in the film forming chamber 2 before and after the coil current $I_c$ flowing through the magnetic coils 24 is reversed in its flowing direction. The reason for this is that so long as the magnetic field exists, the plasma is guided by the magnetic field.

Figure 3:
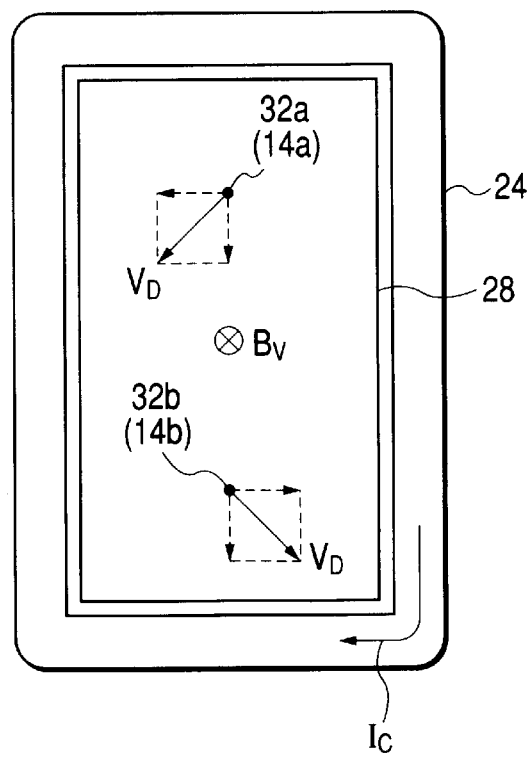
FIG. 3 shows, in a view in the direction D—D in FIG. 1, drift directions of electrons in a magnetic field by the magnetic coil in FIG. 1, before the coil current is reversed in its flowing direction, in a case where a magnetic coil and a pipe are rectangular in cross section.
Figure 5:
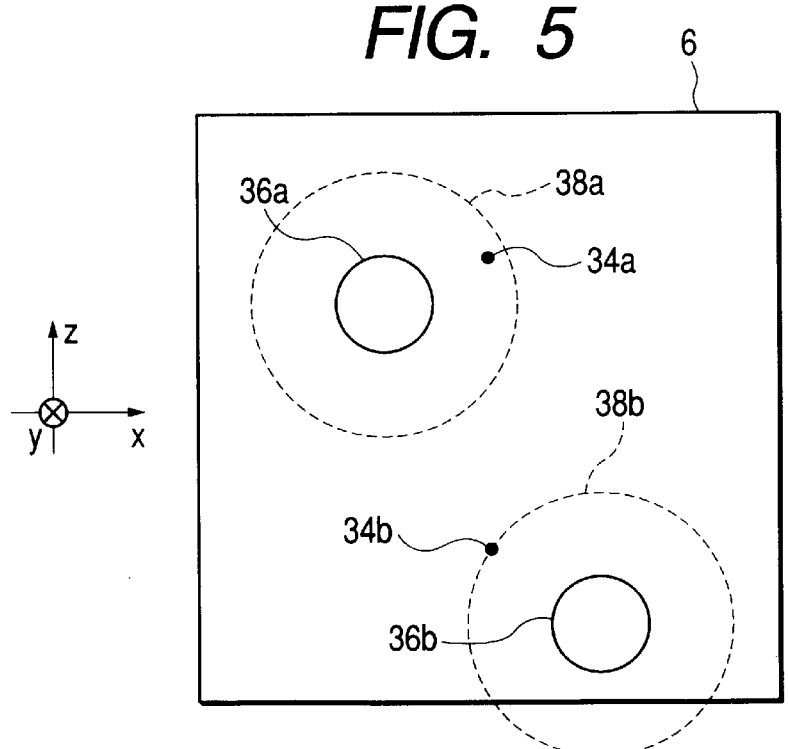
FIG. 5 is a diagram showing film thickness distributions on a surface of a film formed substrate by the cathodes in FIG. 2 before the coil current is reversed in its flowing direction.

When the coil current $I_c$ flows through each magnetic coil 24 in the clockwise direction as viewed from the vacuum arc evaporating source 12, electrons 32a and 32b emitted from cathodes 14a and 14b of the vacuum arc evaporating sources 12 drift obliquely and downward at a drift velocity $V_D$ as shown in FIG. 3. With the drift of the electrons, the plasma 18, which is produced in the vicinity of the cathodes 14a and 14b and is transported by the magnetic field, drift in the same direction as of the electrons. As a result, peak positions 36a and 36b and fringes 38a and 38b of a film thickness distribution of a thin film formed on the surface of the substrate 6 appear at positions shifted obliquely and downward as shown in FIG. 5. FIGS. 3 and 5 respectively correspond to FIGS. 21 and 23 mentioned above. The reason why the drift velocity $V_D$ and the thickness distribution are shifted are as already described in detail.

Figure 4:
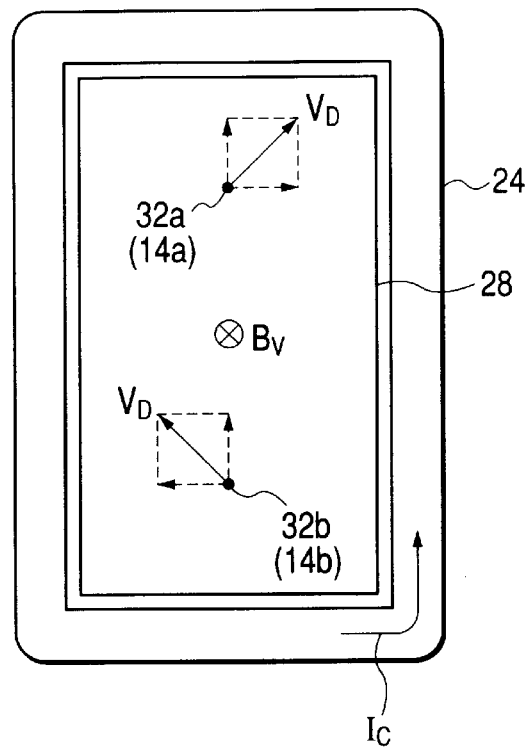
FIG. 4 shows, in a view in the direction D—D in FIG. 1, drift directions of electrons in a magnetic field by the magnetic coil in FIG. 1, after the coil current is reversed in its flowing direction, in a case where a magnetic coil and a pipe are rectangular in cross section.

When the flowing direction of the coil current $I_c$ fed to magnetic coils 24 is reversed, i.e., in the counter clockwise direction as shown in FIG. 4, the gradient $\nabla B$ of the magnetic field developed by the magnetic coils 24 remains unchanged, but the direction of the vector of magnetic field $B_v$ is reversed. As seen also from the equation 2, the drift velocity $V_D$ acting on the electrons 32a and 32b is reversed in a direction opposite to that in the FIG. 3 case. With the drift of the electrons, the plasma 18, which is produced in the vicinity of the cathodes 14a and 14b and is transported by the magnetic field, drifts in the same direction as of the electrons drifting at drift velocity $V_D$.

Figure 6:
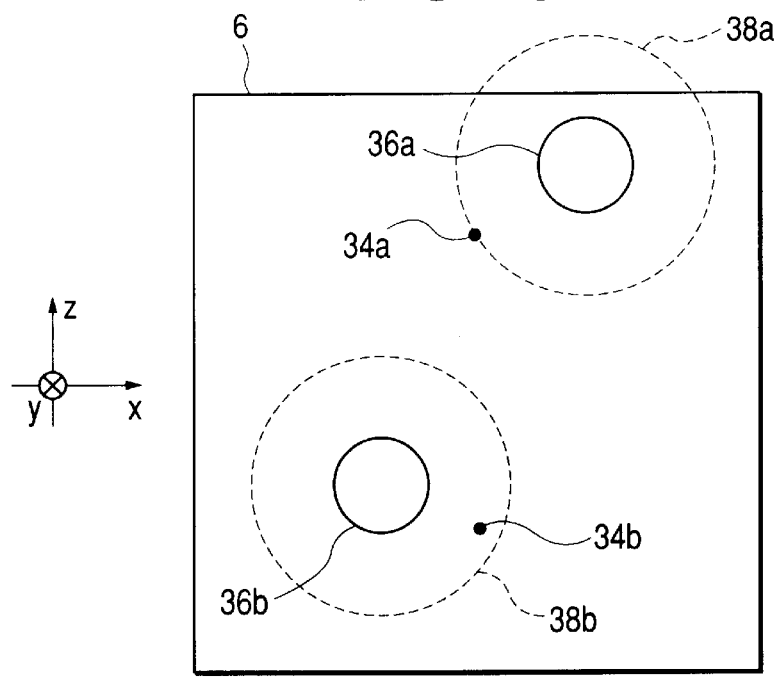
FIG. 6 is a diagram showing film thickness distributions on a surface of a film formed substrate by the cathodes in FIG. 2 after the coil current is reversed in its flowing direction.

As a result, the phenomenon, already stated, that the peak positions 36a and 36b and the fringes 38a and 38b of the thickness distribution on the substrate surface are shifted by the drift of the plasma being under transportation, appears in the inverted state, viz., by inverting a state of the FIGS. 3 and 5 case. Its state is shown in FIG. 6. The peaks 36a and 36b or the like of the film thickness distribution by the cathodes 14a and 14b are shifted obliquely and upward from the positions 34a and 34b corresponding to the cathodes 14a, 14b while a distance between them increases.

Figure 7:
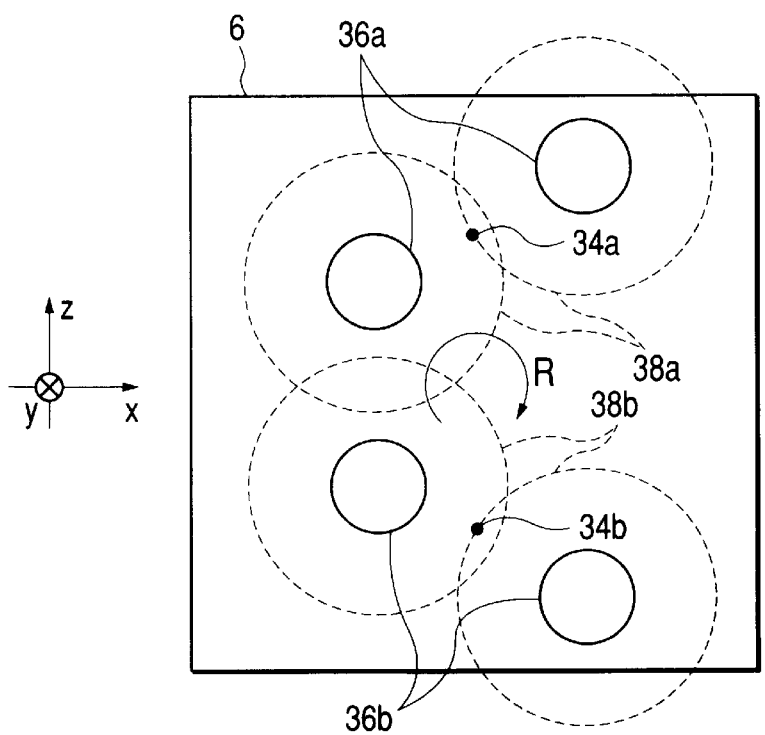
FIG. 7 is a diagram showing film thickness distributions when the FIGS. 5 and 6 distributions are superimposed one on the other.

By reversing the flowing direction of the coil current $I_c$, the thickness distributions shown in FIGS. 5 and 6 are super imposed one on the other into a film thickness distribution as shown in FIG. 7. Thus, peaks 36a and 36b and the fringes 38a and 38b of the film thickness distribution appear on the surface of the substrate 6 in a dispersing fashion. When a time $t_1$ that the coil current $I_c$ flows clockwise is selected to be equal to a time t2 that the current flows counter clockwise, peaks whose magnitudes (film thickness) are substantially equal appear at four positions dispersley. With the dispersion of the peak positions, non-uniformity of the thickness distribution on the surface of the substrate 6 is reduced. Thus, deterioration of the uniformity of the film thickness distribution on the surface of the substrate 6 can be prevented by the drift of the plasma 18 in the magnetic field generated by the magnetic coils 24. As a result, a film may be formed uniformly on a broad area on the substrate 6.

The substrate 6 and the holder 8 holding it may be rotated about the center of the substrate 6 in, for example, a direction of an arrow "R" (or its reverse direction), as shown in FIGS. 1 and 7. By so doing, the non-uniformity of the film thickness distribution is reduced through the rotation of the substrate 6, so that the film thickness on the substrate 6 is more uniform.

The control unit 42 controls the coil power source 40 to reverse the flowing direction of the coil current $I_c$ after a predetermined time elapses. The reversing operation may be performed one time; however, it is preferable to repeat the reversing operation at predetermined time intervals. If so doing, the reducing of the non-uniformity of the thickness distribution caused by reversing the coil current $I_c$ is repeated, and hence, the thickness distribution is more uniform.

The time t1 of flowing the coil current $I_c$ in the predetermined direction and the time $t_2$ of flowing the same in the reverse direction may be selected to be equal with each other. Those times may be selected to be different so as to enhance the uniformity of the film thickness distribution by reducing the non-uniformity of the film thickness distribution in a more sophisticated manner.

It is preferable to repeat the reversing operation of the coil current $I_c$ direction at short time intervals. The reason for this is that it is possible to reduce the concentration of thermal stress on the substrate 6 by ions in the plasma 18 which are incident on the substrate, and hence the thermal stress concentration on the substrate is reduced. One of the preferable ways is to reverse the flowing direction of the coil current $I_c$ at a time interval, which is integer times as long as a time taken for one rotation of the substrate 6. In a specific example, where the time taken for one rotation of the substrate 6 is 5 seconds, the flowing direction of the coil current $I_c$ is reversed at a time interval of 10 seconds.

To more improve the uniformity of the film thickness distribution on the surface of the substrate 6, the following thickness or ion current detecting unit may be employed.

Figure 8:
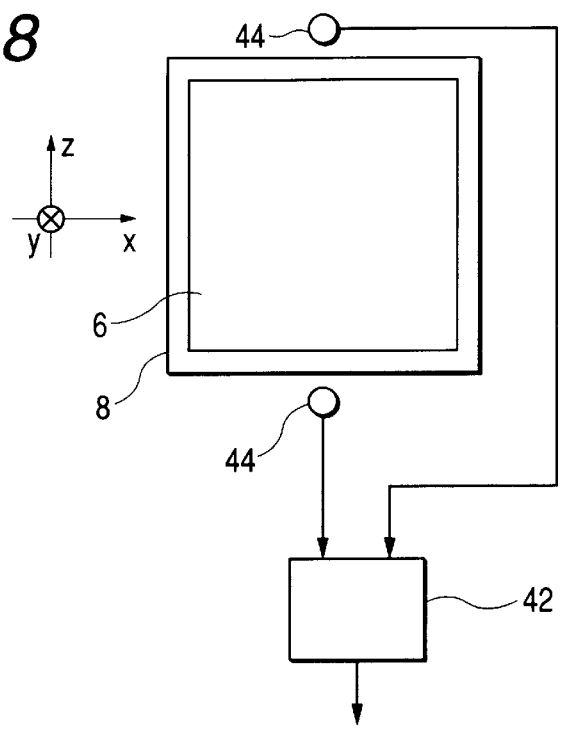
FIG. 8 is a diagram showing a case where two thickness meters are located close to the periphery of the substrate.

In the vacuum arc vapor deposition device shown in FIG. 8, a plurality of thickness meters 44 each for measuring a thickness of a film formed by the plasma 18 are disposed in the vicinity of the substrate 6. Specifically, in this instance, two thickness meters 44 are disposed close to and above and below the substrate 6. The control unit 42 performs the control for reversing the flowing direction of the coil current $I_c$ when a difference between film thickness values as measured by the two thickness meters 44 exceeds a predetermined value.

Where the thickness detecting unit is employed, the vacuum arc vapor deposition device performs the control for reversing the flowing direction of the coil current $I_c$ for reducing the non-uniformity of the thickness distribution on the surface of the substrate 6 while monitoring the film thickness on the surface of the film formed substrate 6 at plural positions close to the periphery of the substrate 6. Accordingly, the uniformity of the thickness distribution on the surface of the substrate 6 is more improved.

Figure 9:
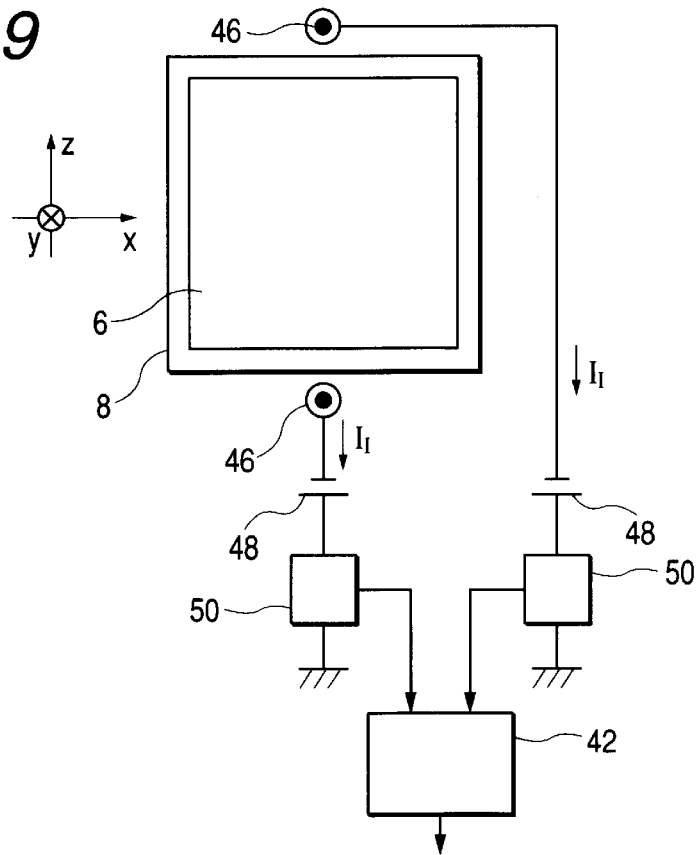
FIG. 9 is a diagram showing a case where two ion current probes are located close to the periphery of the substrate.
Figure 10:
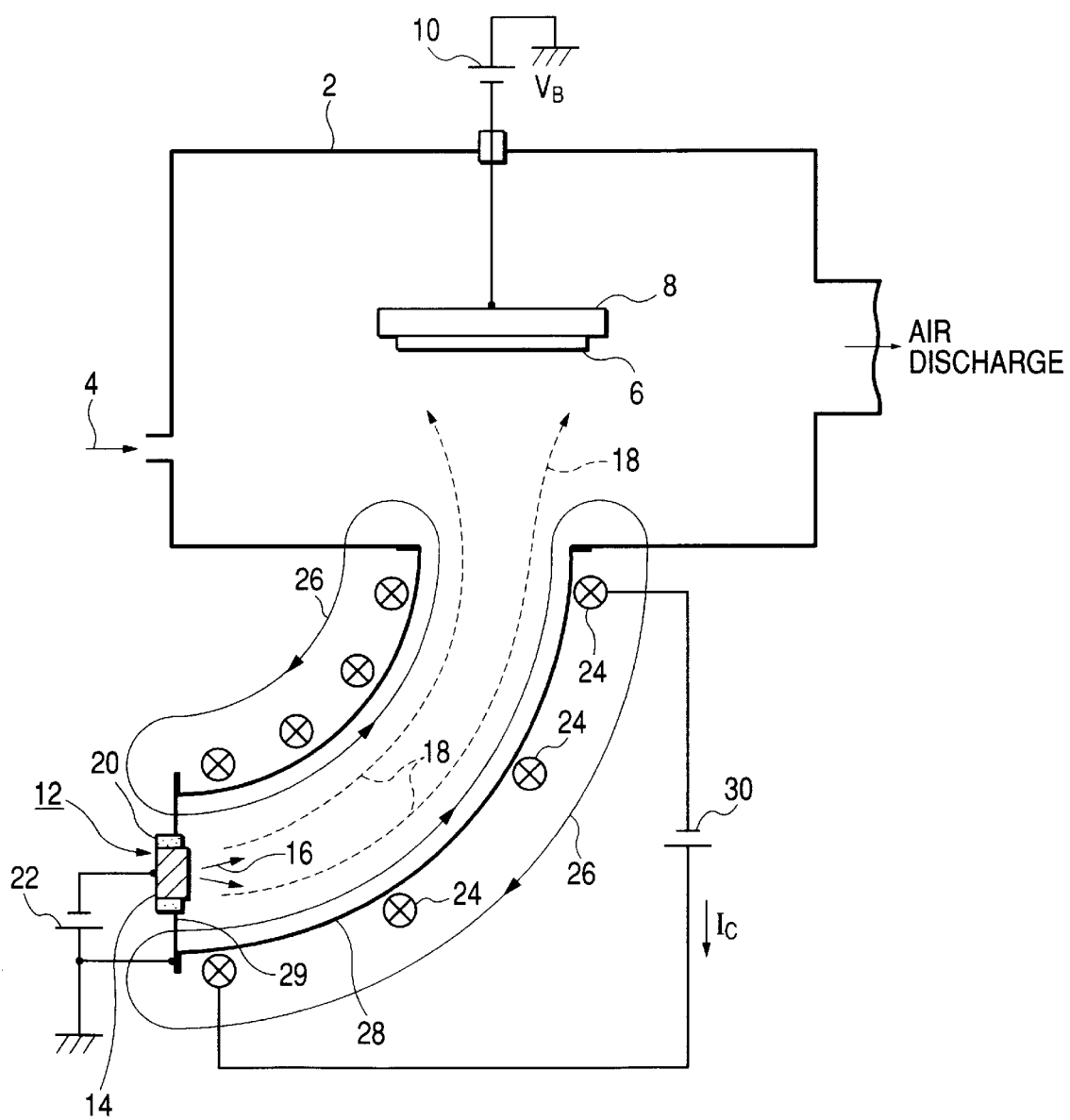
FIG. 10 is a cross sectional view showing a vacuum arc vapor deposition apparatus in related art.
Figure 11:
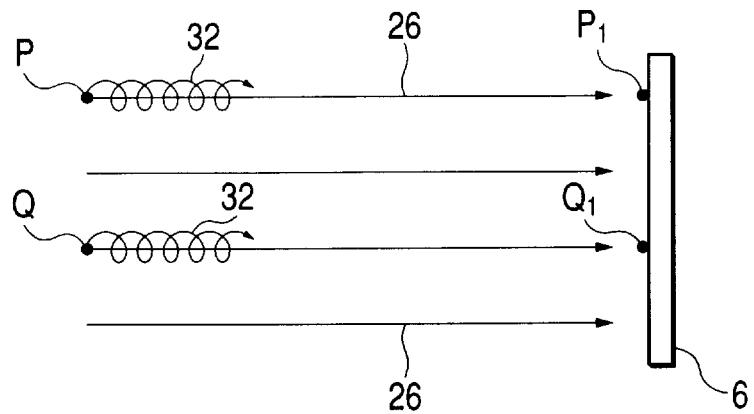
FIG. 11 is a diagram showing electron motions in a uniform magnetic field.
Figure 12:
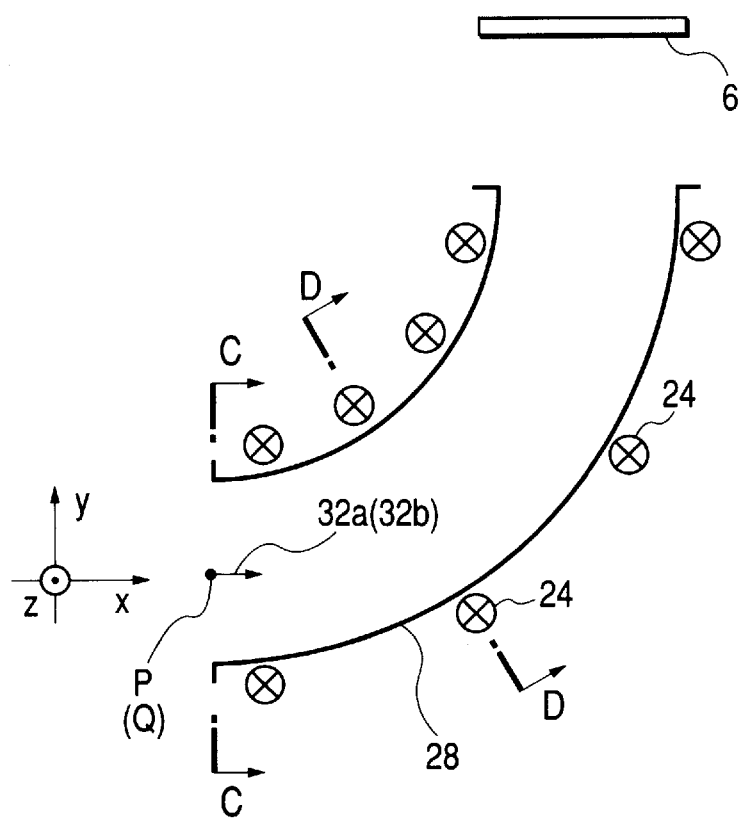
FIG. 12 is a diagram showing a portion of the magnetic coil of the FIGS. 1 and 10 apparatus.
Figure 13:
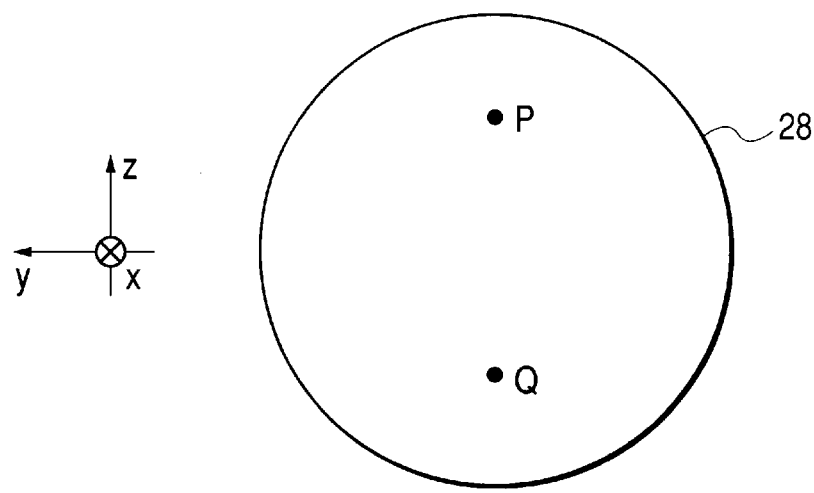
FIG. 13 is a diagram showing a cross section of the FIG. 12 structure as viewed in a direction C—C in a case where a magnetic coil and a pipe are circular in cross section.
Figure 14:
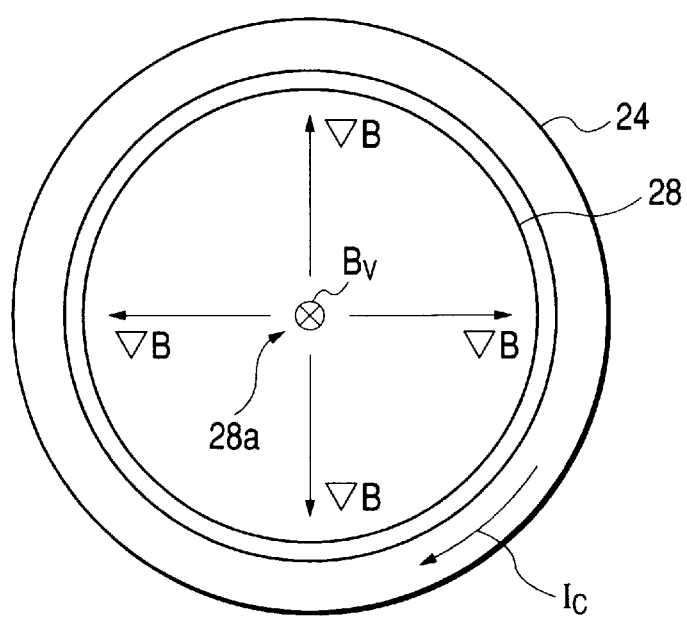
FIG. 14 is a diagram showing a gradation of a magnetic field in a cross section of the FIG. 12 structure as viewed in a direction D—D in a case where a magnetic coil and a pipe are circular in cross section.
Figure 15:
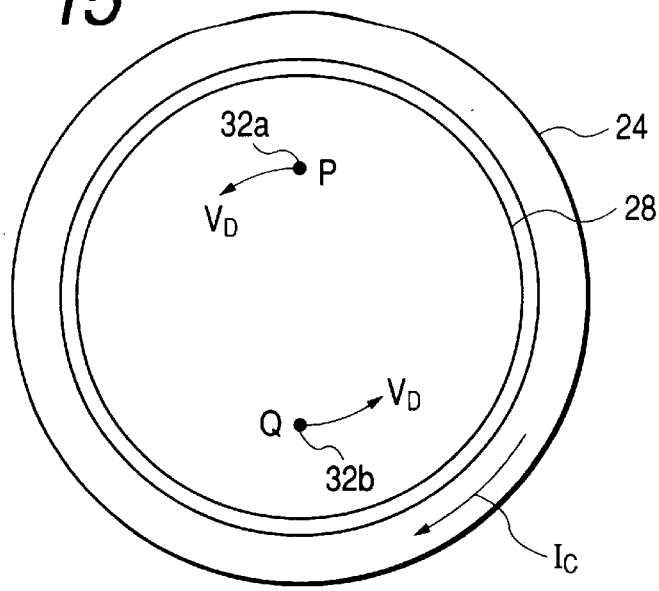
FIG. 15 is a diagram showing drift directions of electrons in a magnetic field developed by the FIG. 14 magnetic coil.
Figure 16:
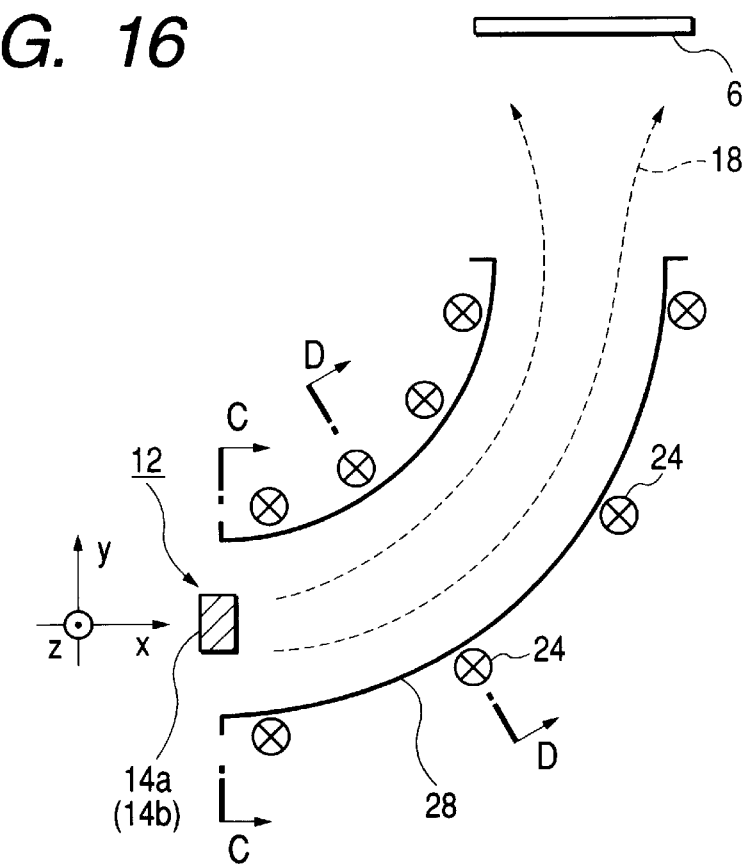
FIG. 16 is a diagram showing a structure of each of the FIGS. 1 and 10, which ranges from the cathode to the substrate.
Figure 17:
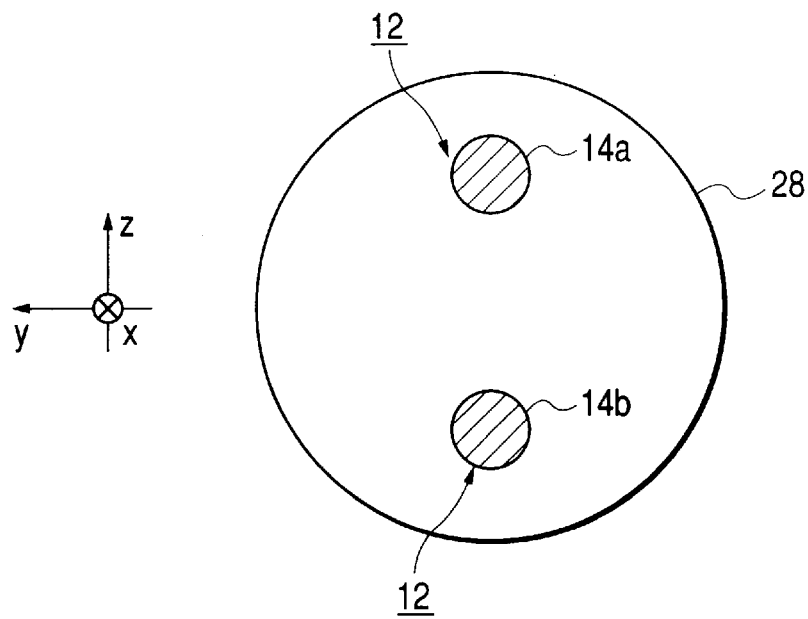
FIG. 17 shows, in a view in the direction of C—C in FIG. 16, an arrangement of cathodes in a case where a magnetic coil and a pipe are circular in cross section.
Figure 18:
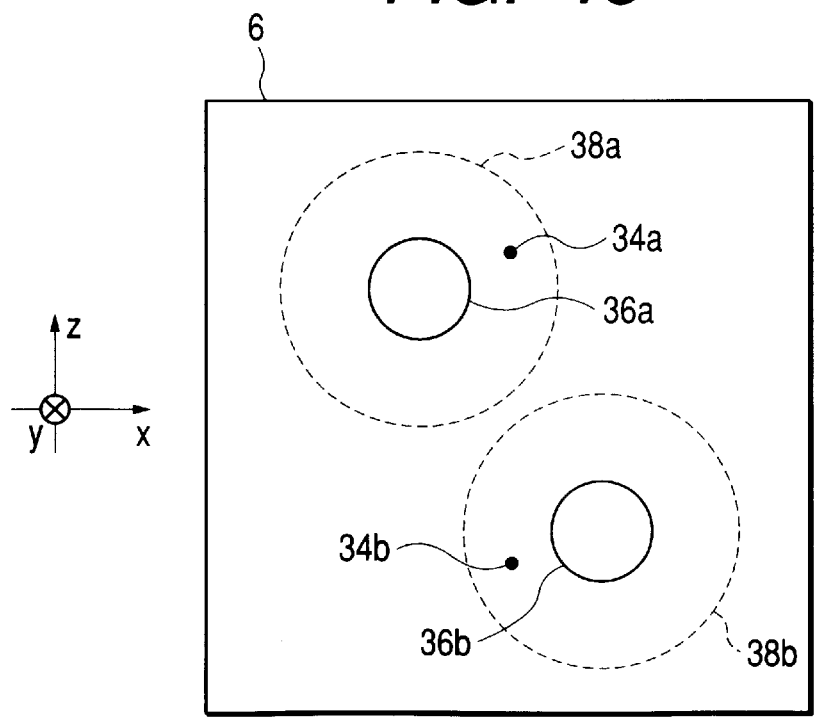
FIG. 18 is a diagram showing film thickness distributions on a surface of a film formed substrate, which are caused by the cathodes in FIG. 17.
Figure 19:
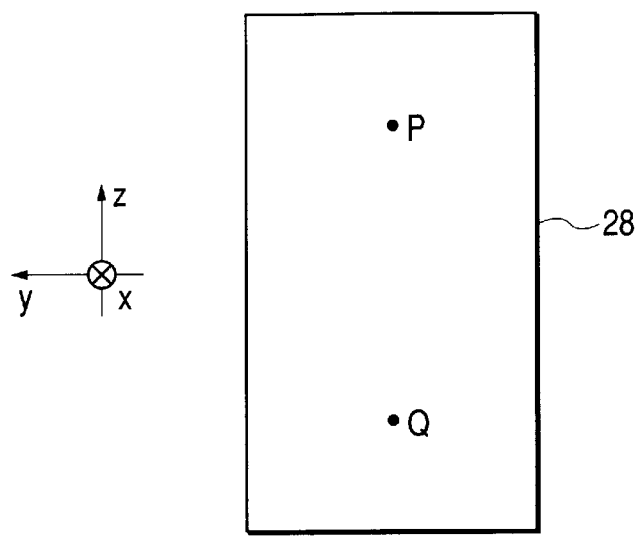
FIG. 19 is a diagram showing a cross section of the FIG. 12 structure as viewed in a direction C—C in a case where a magnetic coil and a pipe are rectangular in cross section.
Figure 20:
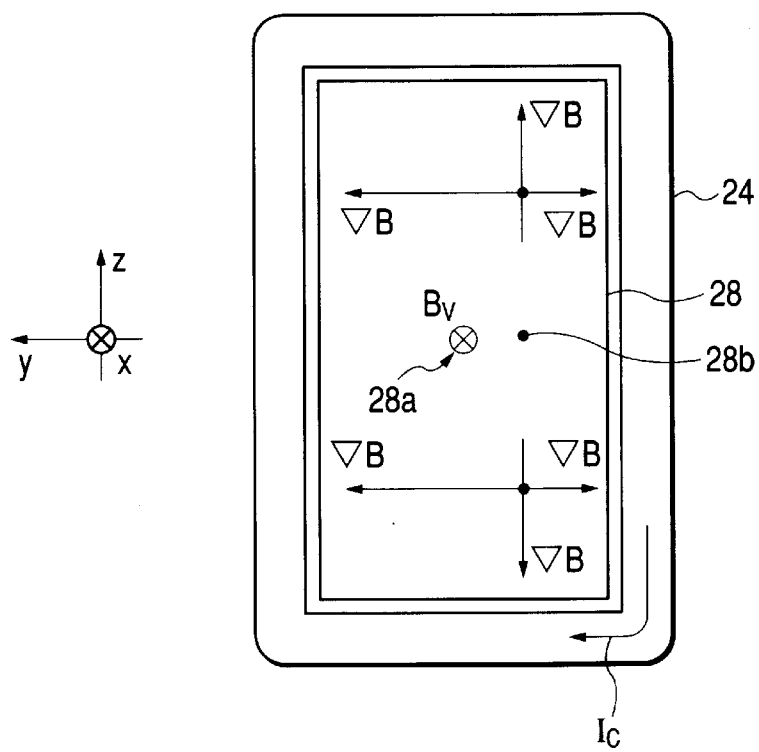
FIG. 20 is a diagram showing a gradation of a magnetic field in a cross section of the FIG. 12 structure as viewed in a direction D—D in a case where a magnetic coil and a pipe are rectangular in cross section.
Figure 21:
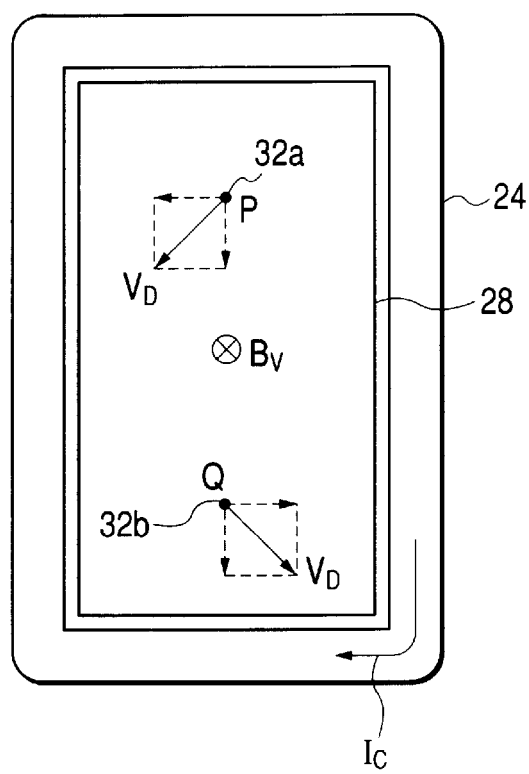
FIG. 21 is a diagram showing drift directions of electrons in a magnetic field developed by the FIG. 20 magnetic coil.

In the vacuum arc vapor deposition device shown in FIG. 9, a plurality of ion current probes 46 are provided in the vicinity of the substrate 6, for measuring ion currents I/ which flows when ions in the plasma 18 are incident thereon. More specifically, in this instance, the two ion current probes 46 are disposed above and below and near the substrate 6. Additionally, two current integrators 50 for integrating ion currents $I_I$ flowing through the ion current probes 46 are provided. The ion current probes 46 may be kept at ground potential. To exactly measure ion currents $I_I$, it is preferable that a bias power source 48 is provided, and it is-negatively biased, as in the instance. The control unit 42 performs the control for reversing the flowing direction of the coil current $I_c$ when a difference between current values integrated by the two current integrators 50 exceeds a predetermined value.

The reason why a film is formed on the substrate 6 by guiding the plasma 18 to the vicinity of the substrate 6, is that ions (ionized cathode material 16) in the plasma 18 are incident on the substrate 6. A correlation is present between the amount of the incident ions and the film thickness. The amount of the incident ions is measured by using the integrated value of the ion currents $I_I$.

Accordingly, by using the ion current detecting unit as mentioned above, the vacuum arc vapor deposition device performs the control for reversing the flowing direction of the coil current $I_c$ for reducing the non-uniformity of the amount of the incident ions while monitoring the amount of incident ions on the substrate 6 at plural locations close to the periphery of the substrate 6. This further improves the uniformity of the thickness distribution on the surface of the substrate 6.

Also in the case where the magnetic coil 24 and the pipe 28 are circular in cross section, the plasma 18 drifts by the gradient $\nabla B$ of the magnetic field, thereby impairing the uniformity of the thickness distribution on the surface of the substrate 6, as described with reference to the FIGS. 13 to 15, 17, and 18. In this case, however, the direction of the drift of the plasma 18 may be reversed by reversing the flowing direction of the coil current $I_c$. With this, the non-uniformity of the thickness distribution may be reduced. Specifically, the degradation of the uniformity of the thickness distribution on the surface of the substrate 6 is prevented by the reversed drift of the plasma 18 in the magnetic field developed by the magnetic coil 24.

In the embodiments mentioned above, a deflection magnetic field is developed by the plurality of magnetic coils 24, and the plasma 18 is deflected and transported. If required, the plasma 18 may be guide to the vicinity of the substrate 6 by the magnetic field, while not defected by the magnetic field. In this case, the macro particles are made fine by converging the plasma 18 to increase the density of the plasma by one or a plurality of magnetic coils, as described above. As long as the plasma 18 is transported by using the magnetic field developed by the magnetic coil, the above-mentioned gradient $\nabla B$ of the magnetic field exists, and it causes the plasma 18 to drift in the predetermined direction. This deteriorates the uniformity of the thickness distribution on the surface of the substrate 6. Similarly, in this case, the direction of the drift of the plasma 18 may be reversed by reversing the flowing direction of the coil current $I_c$. Accordingly, the non-uniformity of the thickness distribution may be reduced.

The present invention thus constructed has the following useful effects.

The vacuum arc vapor deposition device of the invention includes the coil power source and the control unit. Accordingly, the flowing direction of the coil current fed to the magnetic coils is reversed. As a result, the phenomenon that the peak positions of the thickness distribution on the substrate surface are shifted by the drift of the plasma being under transportation, appears in the inverted state on the substrate surface when the coil current fed to the magnetic coils is reversed in its flowing direction. This reversion reduces the non-uniformity of the film thickness distribution, thereby preventing the deterioration of the uniformity of the film thickness distribution on the substrate surface. The result is that a film maybe formed more uniformly over a broader area on the substrate.

When a plurality of vacuum arc evaporating sources are provided, and the magnetic coils generate a deflection magnetic field, the non-uniformity of the thickness distribution by the drift of the plasma is easy to occur. In this case, the effect of improving the non-uniformity of the film thickness distribution is more remarkable when the coil power source and the control unit are provided so that the flowing direction of the coil current fed to the magnetic coils is reversed.

In the vacuum arc vapor deposition device of the invention, the reducing operation for the non-uniformity of the thickness distribution by reversing the flowing direction of the coil current may be carried out repeatedly. Therefore, the uniformity of the thickness distribution is improved.

The vacuum arc vapor deposition device of the invention may perform the control for reversing the flowing direction of the coil current to reduce the non-uniformity of the thickness distribution while monitoring the film thickness on the surface of the film formed substrate at a plurality of locations close to the periphery of the substrate. Accordingly, the uniformity of the thickness distribution on the surface of the substrate is improved.

The vacuum arc vapor deposition device of the invention may perform the control for reversing the flowing direction of the coil current to reduce the non-uniformity of the amount of the incident ions while monitoring the amount of incident ions on the substrate in a plurality of locations close to the periphery of the substrate. Accordingly, the uniformity of the thickness distribution on the surface of the substrate is improved.

What is claimed is:

1. A vacuum arc vapor deposition apparatus comprising:
    a film forming chamber containing substrate and being vacuum discharged;
    a vacuum arc evaporating source for producing a plasma containing a cathode material by vaporizing a cathode by vacuum arc discharge;
    a magnetic coil for generating a magnetic field for deflecting or converging said plasma produced by said vacuum arc evaporating source, and guiding said plasma to the vicinity of said substrate within said film forming chamber;
    a coil power source for feeding a coil current for generating said magnetic field to said magnetic coil, said coil power source reversing a flowing direction of the coil current fed to said magnetic coil;
    a control unit for controlling said coil power source to reverse the flowing direction of the coil current fed to said magnetic coil;
    a plurality of thickness detecting units, disposed in the vicinity of said substrate, each for measuring a thickness of a film formed by said plasma; and
    wherein said control unit performs the control for reversing the flowing direction of the coil current when a difference between film thickness values as measured by said plurality of thickness detecting units exceeds a predetermined value.

2. The vacuum arc vapor deposition apparatus according to claim 1, wherein a plurality of vacuum arc evaporating sources are provided, and said magnetic coil generates a deflection magnetic field for deflecting said plasma.

3. The vacuum arc vapor deposition apparatus according to claim 1, wherein said control unit performs a control for repeatedly reversing the flowing direction of said coil current every predetermined time.

4. The vacuum arc vapor deposition apparatus according to claim 1, wherein the substrate rotates about its center.

5. The vacuum arc vapor deposition apparatus according to claim 4, wherein the flowing direction of the coil current is reversed at a time interval which is integer times as long as a time taken for one rotation of the substrate.

6. The vacuum arc vapor deposition apparatus according to claim 1, wherein said control unit controls a time of flowing the coil current in a predetermined direction and a time of flowing the coil current in a reverse direction to be equal with each other.

7. A vacuum arc vapor deposition apparatus comprising:
    a film forming chamber containing a substrate and being vacuum discharged;
    a vacuum arc evaporating source for producing a plasma containing a cathode material by vaporizing a cathode by vacuum arc discharge;

a magnetic coil for generating a magnetic field for deflecting or converging said plasma produced by said vacuum arc evaporating source, and guiding said plasma to the vicinity of said substrate within said film forming chamber;

a coil power source for feeding a coil current for generating said magnetic field to said magnetic coil, said coil power source reversing a flowing direction of the coil current fed to said magnetic coil;

a control unit for controlling said coil power source to reverse the flowing direction of the coil current fed to said magnetic coil;

a plurality of ion current detecting units, disposed in the vicinity of said substrate, for measuring ion currents which flows when ions in said plasma are incident thereon; and a plurality of current integrators for integrating ion currents flowing through said ion current detecting units, wherein said control unit performs the control for reversing the flowing direction of the coil current when a difference between current values integrated by said plurality of said current integrators exceeds a predetermined value.

8. The vacuum arc vapor deposition apparatus according to claim 7, wherein a plurality of vacuum arc evaporating sources are provided, and said magnetic coil generates a deflection magnetic field for deflecting said plasma.

9. The vacuum arc vapor deposition apparatus according to claim 7, wherein said control unit performs a control for repeatedly reversing the flowing direction of said coil current every predetermined time.

10. The vacuum arc vapor deposition apparatus according to claim 7, wherein the substrate rotates about its center.

11. The vacuum arc vapor deposition apparatus according to claim 10, wherein the flowing direction of the coil current is reversed at a time interval which is integer times as long as a time taken for one rotation of the substrate.

12. The vacuum arc vapor deposition apparatus according to claim 7, wherein said control unit controls a time of flowing the coil current in a predetermined direction and a time of flowing the coil current in a reverse direction to be equal with each other.

13. A vacuum arc vapor deposition apparatus comprising:

a film forming chamber containing a substrate and being vacuum discharged;

a plurality of vacuum arc evaporating sources for producing a plasma containing a cathode material by vaporizing cathodes y vacuum arc discharge;

a magnetic coil provided over substantially the whole circumference of a duct connecting the film forming chamber and the plurality of vacuum arc evaporating sources, the magnetic coil configured for generating a magnetic field for deflecting or converging said plasma produced by said plurality of vacuum arc evaporating sources, and guiding said plasma to the vicinity of said substrate within said film forming chamber;

a coil power source for feeding a coil current for generating said magnetic field to said magnetic coil, said coil power source reversing a flowing direction of the coil current fed to said magnetic coil, the coil power source configured for feeding the coil current to the magnetic coil so that the plasma in the duct drifts to cause the distribution of a film thickness on the substrate to be substantially uniform; and a control unit for controlling said coil power source to reverse the flowing direction of the coil current fed to said magnetic coil.

* * * * *

UNITED STATES PATENT AND TRADEMARK OFFICE
CERTIFICATE OF CORRECTION

PATENT NO. : 6,692,623 B2
APPLICATION NO. : 10/107363
DATED : February 17, 2004
INVENTOR(S) : Koji Miyake It is certified that error appears in the above-identified patent and that said Letters Patent is hereby corrected as shown below:

Column 10,
Line 18, "containing substrate" should read -- containing a substrate --.

Column 12,
Line 14, "cathodes y vacuum" should read -- cathodes by vaccum --.

Signed and Sealed this

Twenty-seventh Day of June, 2006

JON W. DUDAS
*Director of the United States Patent and Trademark Office*